(12) United States Patent
Todter et al.

(10) Patent No.: US 10,526,096 B2
(45) Date of Patent: Jan. 7, 2020

(54) SOLAR WING SYSTEM AND APPARATUS

(71) Applicant: SubSeaSail LLC, San Diego, CA (US)

(72) Inventors: Chris Todter, San Diego, CA (US); Mark Timothy Ott, El Cajon, CA (US); Michael B. Jones, San Diego, CA (US)

(73) Assignee: SubSeaSail LLC, San Diego, CA (US)

( * ) Notice: Subject to any disclaimer, the term of this patent is extended or adjusted under 35 U.S.C. 154(b) by 0 days.

(21) Appl. No.: 16/117,452

(22) Filed: Aug. 30, 2018

(65) Prior Publication Data

US 2019/0352024 A1 Nov. 21, 2019

Related U.S. Application Data

(60) Provisional application No. 62/673,930, filed on May 20, 2018.

(51) Int. Cl.
| | | |
|---|---|---|
| *B64G 1/40* | (2006.01) | |
| *B64G 1/44* | (2006.01) | |
| *H02M 7/44* | (2006.01) | |
| *H02J 7/35* | (2006.01) | |
| *H01L 31/043* | (2014.01) | |

(52) U.S. Cl.
CPC ............. *B64G 1/407* (2013.01); *B64G 1/443* (2013.01); *H01L 31/043* (2014.12); *H02J 7/35* (2013.01); *H02M 7/44* (2013.01)

(58) Field of Classification Search
CPC ........... B64G 1/407; B64G 1/443; H02J 7/35; H02M 7/44
See application file for complete search history.

(56) References Cited

U.S. PATENT DOCUMENTS

| | | | | |
|---|---|---|---|---|
| 5,131,341 | A * | 7/1992 | Newman | B63H 21/17 114/102.1 |
| 6,105,524 | A * | 8/2000 | Dane | B63H 9/0607 114/39.21 |
| 7,047,902 | B1 * | 5/2006 | Little | B63B 17/02 114/292 |
| 8,314,324 | B2 * | 11/2012 | Tell | H01L 31/0392 136/244 |
| 2007/0051292 | A1 * | 3/2007 | Kilbourn | B63B 35/00 114/311 |
| 2015/0266555 | A1 * | 9/2015 | Dane | B63H 9/0607 114/102.16 |
| 2017/0267324 | A1 * | 9/2017 | Vandyck | B63H 9/0607 |

* cited by examiner

*Primary Examiner* — S. Joseph Morano
*Assistant Examiner* — Jovon E Hayes
(74) *Attorney, Agent, or Firm* — Thibault Patent Group

(57) ABSTRACT

Various embodiments of a solar wing are disclosed. A solar wing sail generates power from a series of parallel, spaced-apart solar rib assemblies, each assembly having a solar array mounted on top. A sail is formed of transparent material that surrounds the solar rib assemblies, forming an airfoil. The power generated by the solar wing sail can be used to charge batteries and operate onboard electronics.

19 Claims, 13 Drawing Sheets

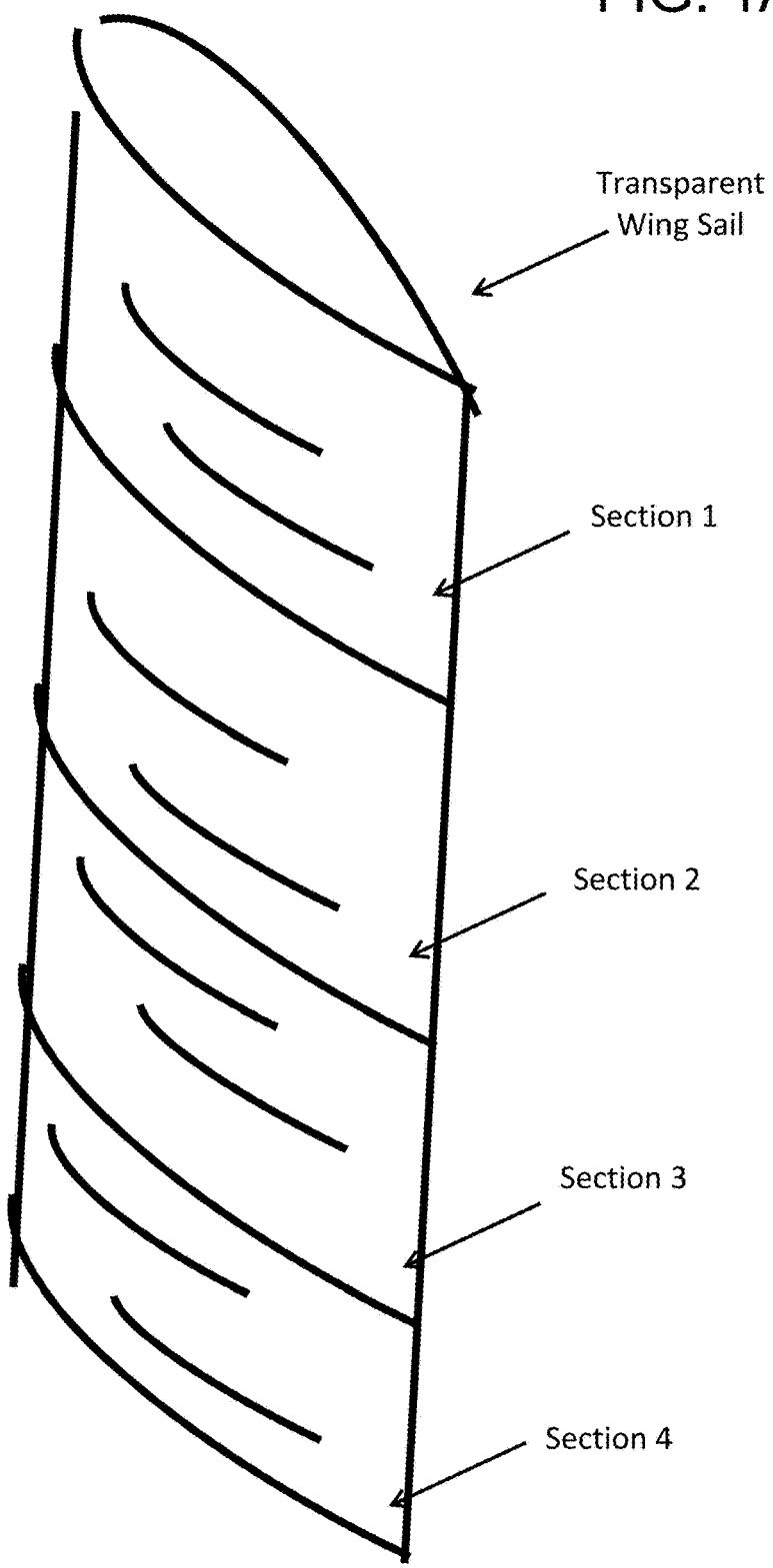

US 10,526,096 B2

SOLAR WING SYSTEM AND APPARATUS

CROSS-REFERENCE TO RELATED APPLICATION

The present application claims the benefit of U.S. provisional patent application Ser. No. 62/673,930, filed on May 20, 2018.

BACKGROUND

Field of Use

The present application relates to the solar power industry. More specifically, the present application relates to the generation of solar energy for use on mobile platforms, such as aircraft and sailing vessels.

Description of the Related Art

Producing electricity from solar panels has existed for several decades. In residential applications, solar panels produce a D.C. voltage when illuminated by the sun, and the DC voltage is converted into an AC voltage by an inverter suitable for residential voltage and frequency.

The concept of solar power generation has been adapted for mobile applications such as on boats and recreational vehicles. The power generated by these mobile solar panels is typically used to recharge primary RV/marine batteries and to provide power to onboard electronics after being converted into AC power by an onboard inverter. Much less power is typically generated in mobile applications, as compared to residential applications, due to the fact that boats and RV's require much less power than a residence, but also because such mobile platforms do not have the surface area needed to mount a large number of panels. For example, an after-market solar system for marine vessels may comprise a single solar panel capable of generating only two hundred watts of power.

Large sailing vessels pose a great challenge for using solar panels to generate electricity. Sailboats typically do not have large, flat areas to mount solar panels. Further, the sails tend to cast shadows onto the deck as a sailboat moves through the water, making solar power generation difficult, especially for a multi-panel system, as any amount of shading of a solar panel causes its output to drop precipitously.

It would be desirable, therefore, to generate electricity for sailing vessels, and in other applications as well, in amounts greater than previously contemplated, while avoiding the problem of shading.

SUMMARY

The embodiments described herein relate to a solar wing sail for generating electricity for use onboard a sailing vessel. In one embodiment, a sailing vessel is described, comprising a hull, a mast coupled to the hull, a plurality of solar rib assemblies coupled to the mast, separated from each other by one or more predetermined distances, each of the plurality of solar rib assemblies for generating electric power from the sun, and a transparent sail coupled to at least some of the plurality of solar rib assemblies along an edge of the plurality of solar rib assemblies to form an airfoil.

In another embodiment, a solar wing sail is described, comprising a plurality of solar rib assemblies, parallel and spaced apart from each other, each comprising a structural rib, comprising a mast hole formed though a portion of the structural rib, sized and shaped to accommodate a mast of a sailing vessel, a solar array mechanically coupled to the structural rib, and a rotary electrical DC coupling device for coupling a DC voltage generated by the solar array to a fixed location, and a sail formed around a perimeter of each of the plurality of solar rib assemblies to form an airfoil.

BRIEF DESCRIPTION OF THE DRAWINGS

The features, advantages, and objects of the embodiments of the present invention will become more apparent from the detailed description as set forth below, when taken in conjunction with the drawings in which like referenced characters identify correspondingly throughout, and wherein:

FIG. 1A is a perspective view of one embodiment of a transparent wing as used in the solar wing of FIG. 1;

DETAILED DESCRIPTION

The present disclosure describes application of solar power-generating equipment for use in a variety of applications. Generally speaking, the present application allows the use of solar cells to generate electricity in applications normally devoid of such use. For example, one or more solar panels may be used on an airplane, a sailboat or in other mobile or fixed applications to generate electricity for the airplane, sailboat or other applications.

In one embodiment, one or more solar power-generating devices are enclosed within a structure, such as an airplane wing or sailing vessel wing. The structure comprises transparent material that allows photons from the sun to energize the solar power-generating devices, thus producing electricity for an airplane or sailing vessel. The enclosure prevents environmental damage to the solar power-generating equipment, while allowing the sun to penetrate the enclosure.

In one embodiment, a solar wing is described, for use on airplanes. In this embodiment, one or more solar cells are mounted inside one or both wings, and the wing surface comprises a transparent material to allow the sun to energize the solar cells.

In another embodiment, a solar wing sail is described for use on sailing vessels. One or more solar arrays are mounted to respective "ribs" of a sail or "wing". The ribs are generally airfoil shaped when viewed from above, with multiple ribs forming a support structure for forming a lift-producing wing. A sail is wrapped around the edges of the ribs to form a three-dimensional airfoil, the sail being at least somewhat transparent, allowing the sun to illuminate the solar panels no matter which orientation the sailing vessel may be heading.

Figure 1:
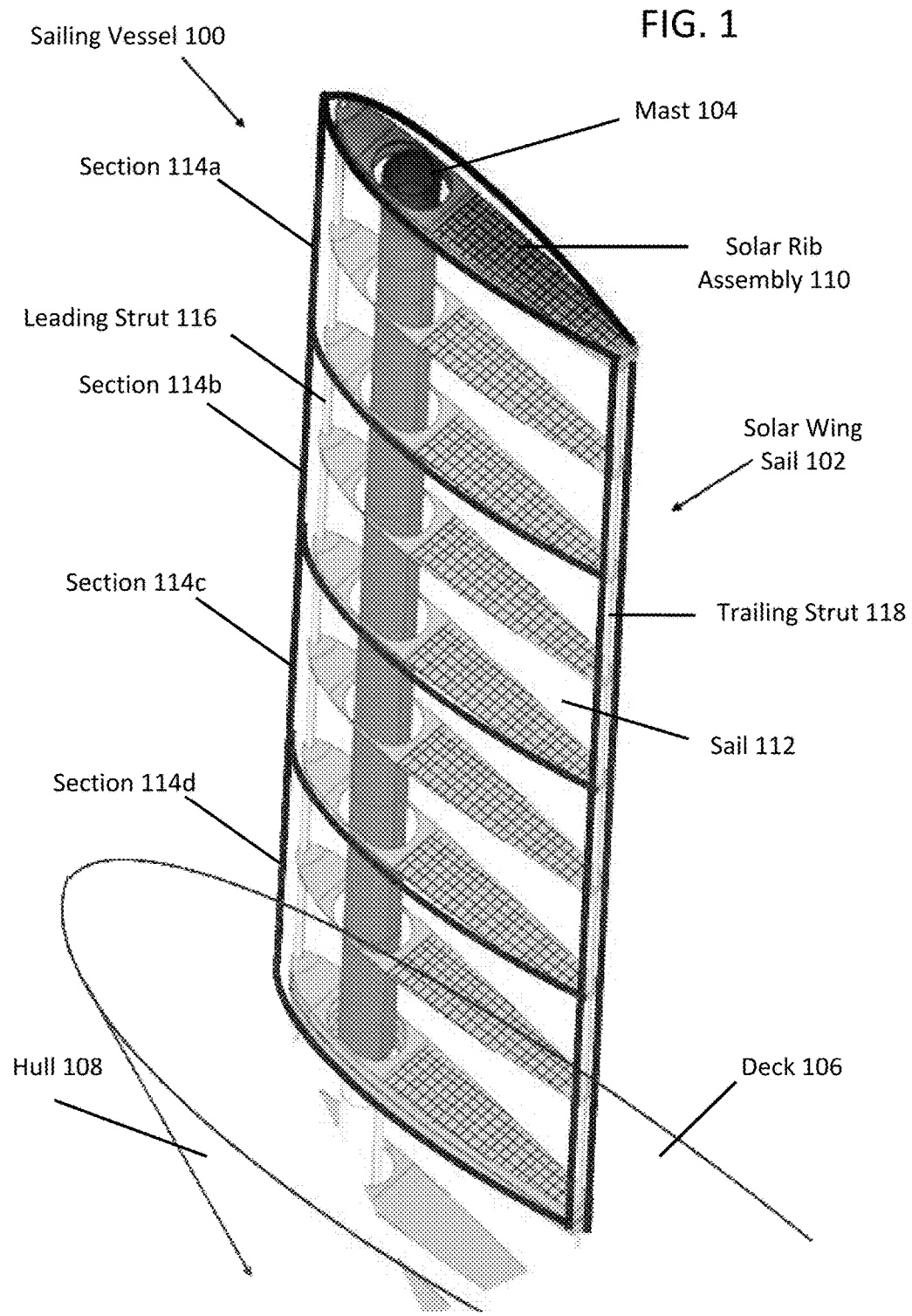
FIG. 1 is a perspective view of one embodiment of a sailing vessel comprising a solar wing sail in accordance with the teachings herein.

FIG. 1 is a perspective view of one embodiment of a sailing vessel 100 comprising a solar wing sail 102 in accordance with the teachings herein. Solar wing sail 102 is shown mounted to mast 104, which in turn is mounted through deck 106 of sailing vessel 100 and secured inside hull 108. Solar wing sail 102 is used to both propel sailing vessel 100 through water, as well as to generate electric power for use by one or more electronic devices onboard sailing vessel 100.

Solar wing sail 102 comprises a number of parallel, spaced apart solar rib assemblies, one of which is plainly visible as solar rib assembly 110 (the remaining solar rib assemblies, as well as a majority of mast 104, are shown in a lighter line thickness to denote their placement behind sail 112). While solar wing sail 102 is shown in FIG. 1 as having nine solar rib assemblies, other embodiments may comprise a greater, or a fewer, number of solar rib assemblies. Also, while the size of each of the solar rib assemblies is shown to be the same, in other embodiments at least some of the solar rib assemblies may be sized different than others. For example, in one embodiment, each successive solar rib assembly may be shorter in length than a previous solar rib assembly, to form a triangular wing sail.

Sail 112 is manufactured generally from a lightweight, thin, transparent and durable material, such as plastic, or a polyester film, e.g. Mylar, in order to allow sunlight to illuminate solar arrays that comprise one or more of the solar rib assemblies. In other embodiments, sail 112 is manufactured from a semi-transparent material such as polycarbonate. Solar wing sail 102 is generally free to rotate about mast 104 to maximize lift in various wind and heading situations.

In the embodiment shown in FIG. 1, sail 112 is transparent and formed into four horizontal sections 114a-114d, as shown in FIG. 1A. each section comprising a height approximately equal to the distance between every other solar rib assembly and a length approximately equal to a perimeter of solar rib assembly 110. This allows for easy sail installation around the solar rib assemblies vs. a single, large sail. Each horizontal portion comprises a top edge and a bottom edge comprising one or more fasteners, the fasteners for mechanically coupling the top edge to a first solar rib assembly perimeter and the bottom edge to a second solar rib assembly perimeter. In one embodiment, the perimeter of each solar rib assembly comprises a vertical mounting strip comprising reciprocal fasteners that mate with the fasteners located on the top and bottom edges of the horizontal sail portions. For example, each vertical mounting strip may comprise a fabric of "loops", while the top edge and bottom edge of each horizontal sail portion may comprise a reciprocal fabric of "hooks", similar to a Velcro® fastener system. In another, related embodiment, the top edge of each horizontal sail portion may comprise a fabric of hooks on one side, and a fabric of loops on the other, so that a top edge of each horizontal sail portion mates with a reciprocal loop fabric mounted to the horizontal strip, while a bottom edge of another horizontal sail portion comprises a fabric of hooks overlapping and attaching to the fabric of loops on the top edge.

In other embodiments, sail 112 could comprise a single sheet of material, more than four sections, or less than four sections. In one embodiment, sail 112 is manufactured from a flexible, transparent material that allows sail 112 to furl. For example, in one embodiment, sail 112 can be raised and lowered over the solar rib assemblies using, for example, traditional ropes and pulleys. In other embodiments, sail 112 is manufactured from a rigid material, such as plastic or mylar, or a semi-rigid material such as clear PVC, acrylic, acetate, or some other material that does not allow sail 112 to furl.

Figure 2:
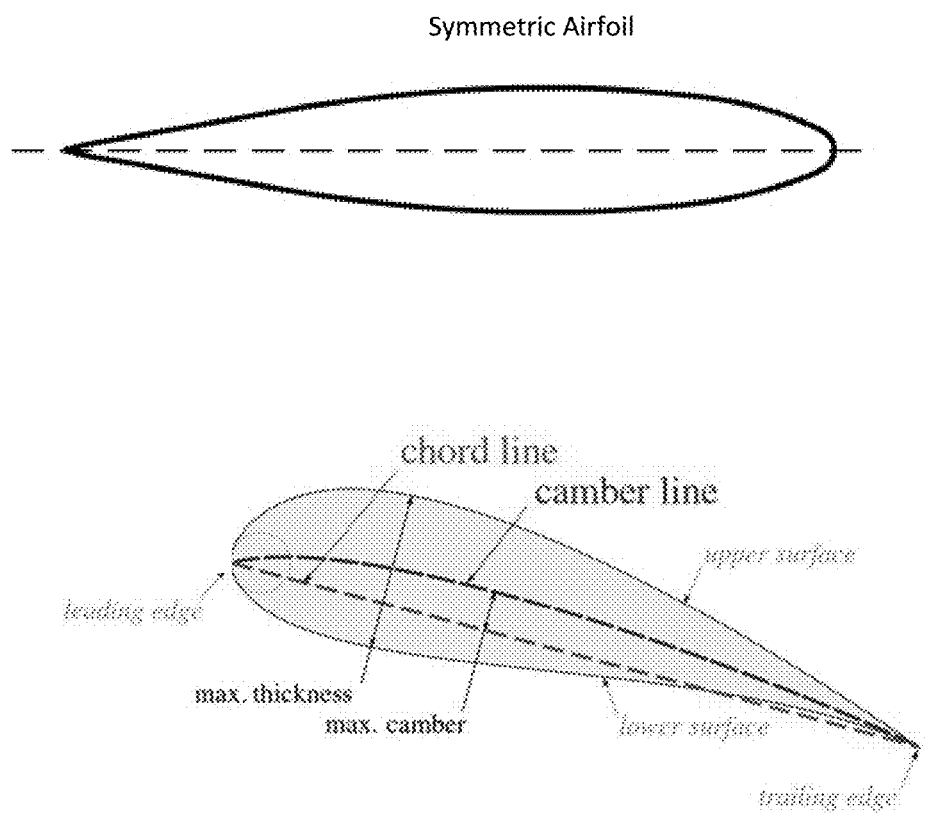
FIG. 2 is a diagram showing a symmetric airfoil shape.

Sail 112 forms an airfoil when wrapped around the perimeter of each of the solar rib assemblies. In the embodiment shown in FIG. 1, the airfoil is generally symmetrical, i.e., a chord of the airfoil matches a camber of the airfoil, as shown in FIG. 2, which shows both a traditional airfoil and a symmetric airfoil. The symmetric nature of the airfoil allows solar wing sail 102 to be positioned both for sailing on a starboard tack as well as sailing on a port tack, i.e., positioned to the starboard or the port.

Figure 3:
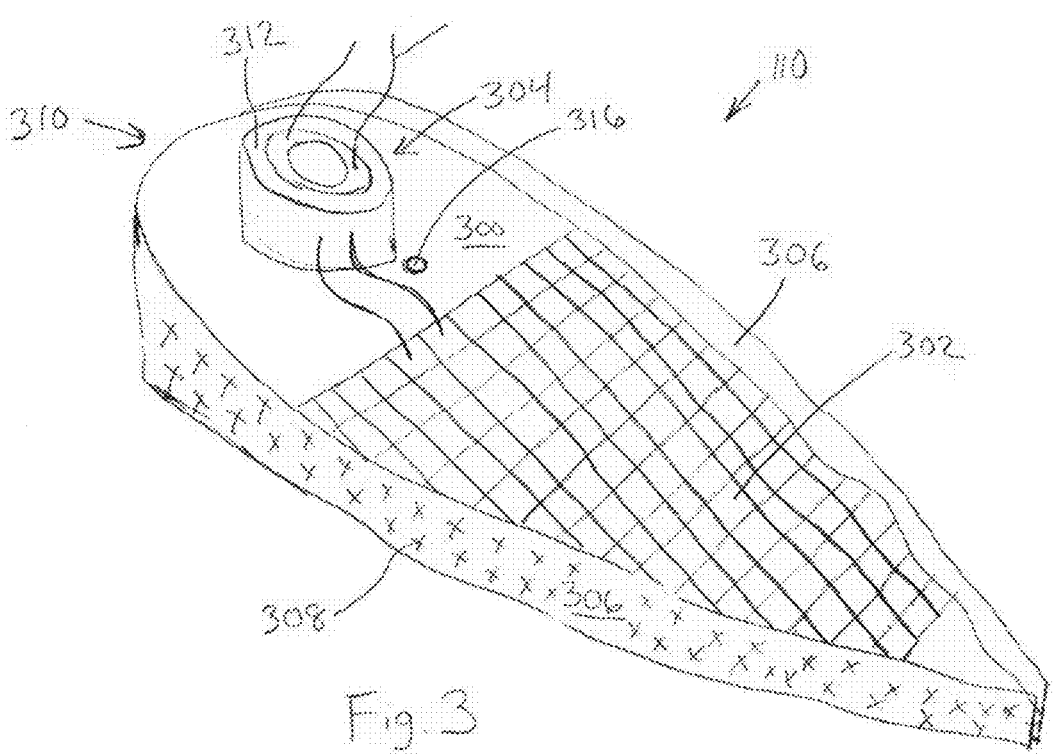
FIG. 3 illustrates a perspective view of one embodiment of a solar rib assembly as used in the solar wing sail of FIG. 1.

FIG. 3 illustrates a perspective view of one embodiment of a typical solar rib assembly 110. Shown is structural rib member 300, solar array 302, rotary electrical DC coupling device 304, vertical mounting strip 306, and fasteners 308.

Structural rib member 300 forms a mechanical platform to support solar array 302 as well as to locate rotary electrical DC coupling device 304 perpendicularly through a leading end portion 310 of solar rib assembly 110. In another embodiment, structural rib member 300 and solar array 302 are formed as a single unit. One or more vertical mounting strips 306 may be installed around a perimeter of structural rib member 300 for mechanically coupling sail 112 around the perimeter of one or more of the solar rib assemblies. In this embodiment, vertical mounting strip 306 comprises a continuous, thin strip of metal or other rigid material, coupled vertically to the perimeter of solar rib member 300. In other embodiments, vertical mounting strip 306 need not be continuous. Vertical mounting strip 306 is shown in FIG. 3 as extending past upper and lower planar surfaces of structural rib member 300, in order to provide sufficient surface area for sail 112 to be attached. In other embodiments where structural rib member 300 is of sufficient thickness, for example greater than four inches, vertical mounting strip 306 may not be needed. Vertical mounting strip 306 further comprises one or more fasteners 308, such as a male portion of a number of snaps, hooks, or a fabric of small hooks, such as those used in a hook-and-loop fastener, such as one part of a Velcro® fastener. In an embodiment where the thickness of solar rib member 300 is sufficient to secure sail 112 directly to the edge of solar rib member 300, fastener(s) 308 may be directly located around the edge of structural rib member 300.

Electrical DC coupling device 304 comprises an electromechanical device, such as a slip ring or a rotary inductive coupler, that allows for the transmission of power and/or electrical signals from solar array 302 to a fixed destination, such as to a battery, battery charger, or to one or more electronic devices onboard sailing vessel 100. Slip rings and inductive couplers are well-known in the art and can improve mechanical performance, simplify system operation and eliminate damage-prone wires dangling from movable joints. In the embodiment shown in FIG. 3, electrical DC coupling device 304 comprises a slip ring assembly mounted through a mast hole (not shown) located at leading end 310 of structural rib member 300. The slip ring comprises a first portion that is attached to the solar rib assembly and a second portion that may be mechanically coupled to mast 104 by the use of screws, rivets, bolts, or some other mechanical fastening devices. The first portion is in mechanical contact with the second portion, such that power from solar array 302 is transferred from the first portion to the second portion, even as the solar rib assembly is pivoted around mast 104 as sailing vessel 100 sails through various wind and heading directions. It should be understood that in some embodiments, electrical DC coupling device is not used, and the DC voltage from each solar array on each solar rib assembly is wired together in series or in parallel, with the wires from each solar array passing either through rib member 300 via one or more holes 316 formed through rib member 300 or simply routed over a perimeter of each solar rib assembly. In these embodiments, mast hole 606 may be sized and shaped to accommodate a diameter of mast 104 such that little to no gap is present between mast 104 and a circumferential edge of mast hole 606.

In one embodiment, electrical DC coupling device 304 is used only on one of the solar rib assemblies in solar wing sail 102. In this embodiment, voltages from other solar rib assemblies may be provided to a central location, such as a circuit board affixed to one of the solar rib assemblies via through the holes 316 or perimeter routing, as described above, and combined in series or parallel. In an embodiment where DC voltages from the solar arrays are combined in parallel, each positive lead from each solar array 302 may be connected to one another via an anode of a respective diode that isolates each solar arrays from each other. All of the cathodes of the diodes are electrically coupled together, resulting in voltage and current source dependent upon the voltage and current generated by each of the solar arrays 302. All of the negative leads from the solar arrays 302 may be electrically tied together at or near the circuit board, and two wires may be routed down through mast 104 (when mast 104 is hollow), one representing the combined positive leads of the solar arrays and one representing the negative leads of the solar arrays. The wires may be provided to a battery or a battery charge controller to provide power to electronics onboard sailing vessel 100. It should be understood that other known methods could be used to wire the solar arrays in parallel. Many modern inverters allow for coupling solar arrays in parallel, and such an inverter could be mounted to solar rib assembly 110, with voltages from the various solar arrays wired in parallel, and an AC output coupled to an inductive coupler, as described later herein.

Figure 4:
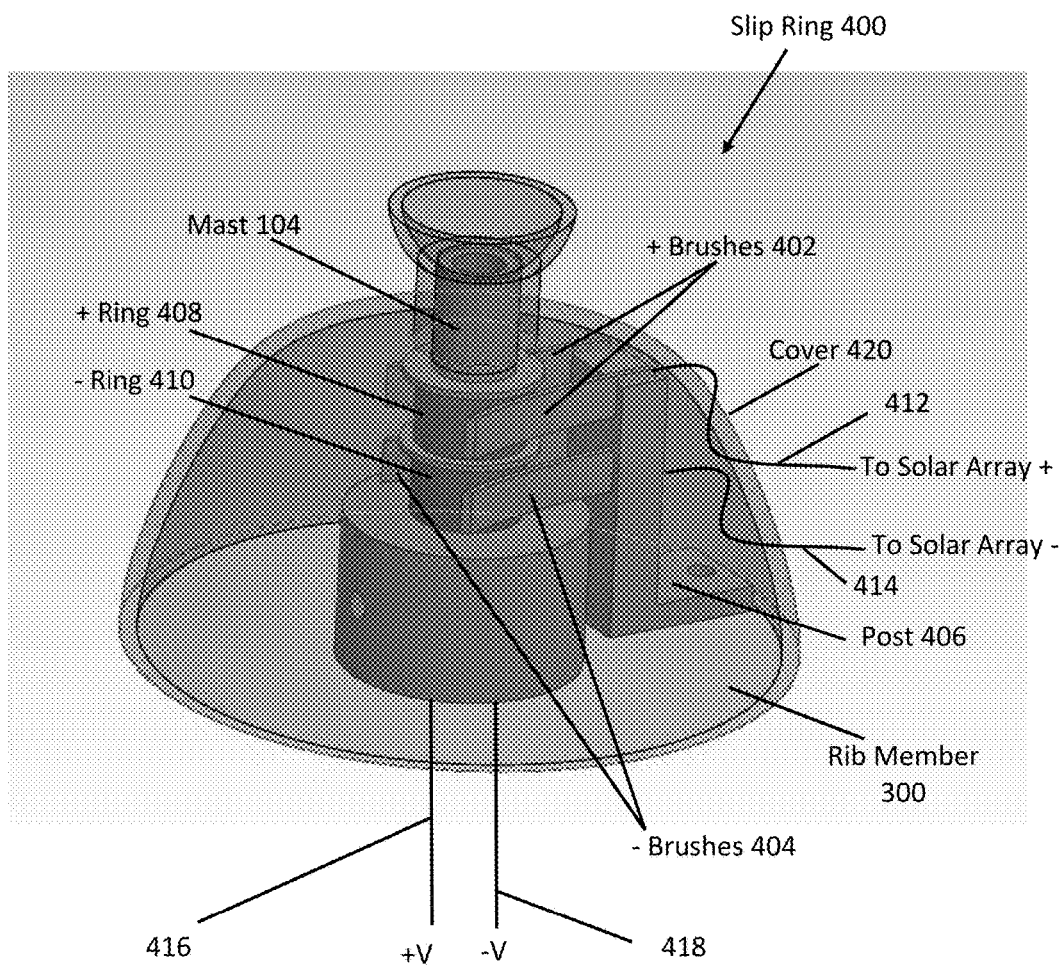
FIG. 4 is a perspective view of an electrical DC coupling device as used in the solar rib assembly of FIG. 1.

Details of one embodiment of a DC slip ring 400 is shown in FIG. 4, some lines shown in phantom view. Slip ring 400 is shown mounted to solar rib member 300 and over mast 104. A rotatable portion of slip ring 400 comprises post 404 that is mechanically coupled to rib member 300 and supports a pair of positive metal brushes 402 and a pair negative metal brushes 404 that are in contact with a fixed portion of slip ring 400, namely positive ring 408 and negative ring 410, respectively. The brushes may comprise conductive strips of metal, or metallic brushes, that are biased towards the rings, so that they make contact with the rings via a spring force. Positive brushes 402 and negative brushes 404 are electrically connected to positive and negative terminals of solar array 302 via wires 412 and 414, respectively. The voltage from solar array 302 is coupled from the brushes, to the rings and then to positive wire 416 and negative wire 418, where the wires are routed, in one embodiment, down through mast 104 (when mast 104 is hollow) and to a fixed destination, such as a battery charge controller or directly to one or more batteries. In the embodiment shown in FIG. 4, a cover 420 is placed over the components of the slip ring, in order to protect the components from the deleterious effects of a marine environment.

Figure 5:
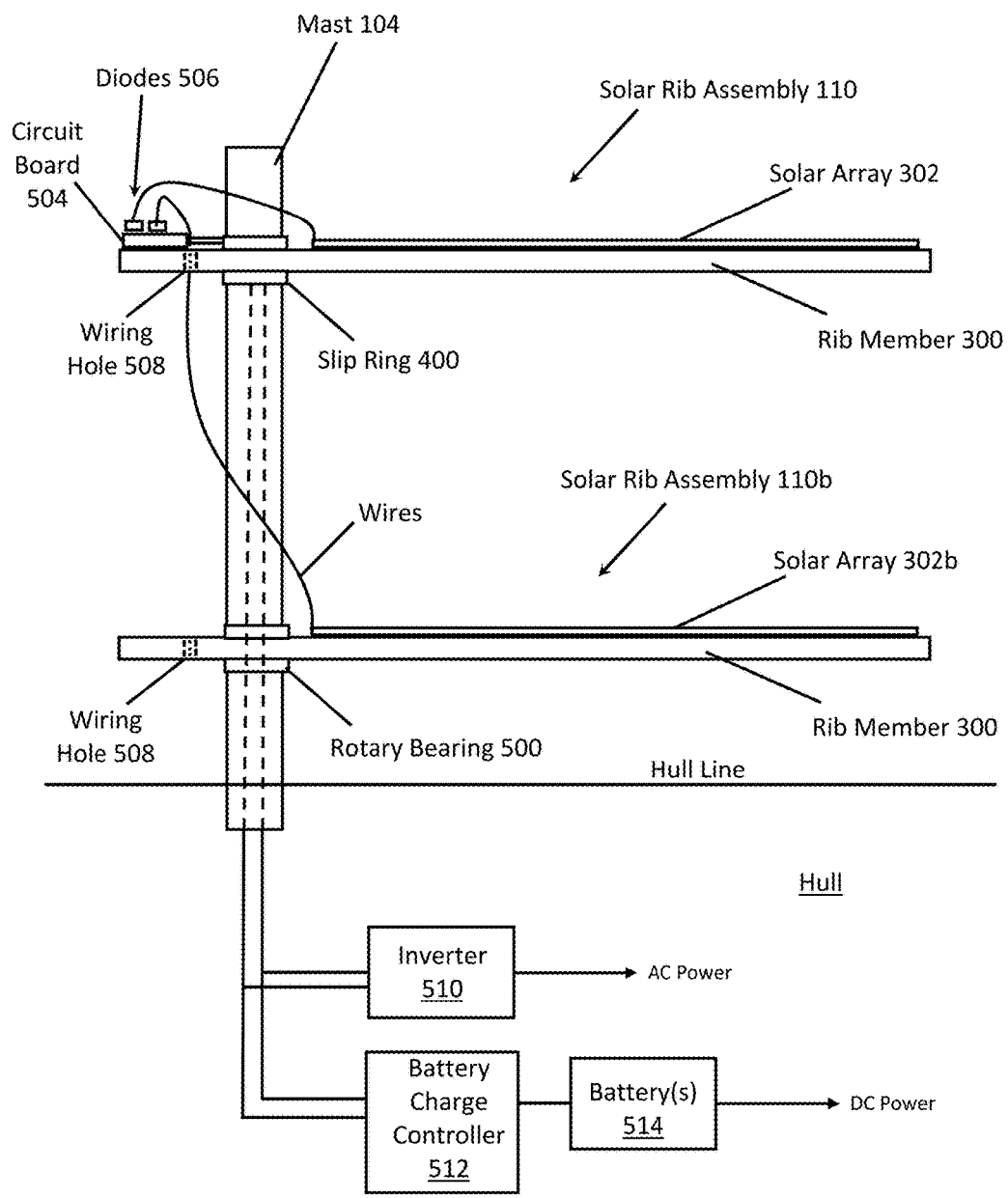
FIG. 5 is a side view of one embodiment of a portion of the sailing vessel shown in FIG. 1, illustrating two solar rib assemblies coupled to a mast and electrically coupled together.

FIG. 5 illustrates one embodiment of solar wing sail 102, showing a side view of a portion of solar wing sail 102 installed onto mast. In this view, only the two upper-most solar rib assemblies are shown, each rib assembly comprising a solar array 302 mounted to a rib member 300. Solar rib assembly 110 comprises slip ring 400, while solar rib assembly 110b utilizes a rotary bearing 500 that allows rib assembly 110b to rotate smoothly around mast 104. Rotary bearings are well-known mechanical rolling-element bearings, which carry a load by placing rolling elements (such as balls or rollers) between two bearing rings called races. The relative motion of the races causes the rolling elements to roll with very little rolling resistance and with little sliding. In other embodiments, bearing 500 is not used, and rib assembly 110b pivots around mast 104 via mast hole 606.

The voltage from solar array 302b is carried up to circuit board 504, in one embodiment through wiring hole 508, where it is combined in parallel, via diodes 506, with the voltage from solar array 302. In another embodiment, the voltages may be combined in series. In either case, the combined voltage from circuit board 500 is provided to slip ring 400, where it is transferred to rings 408 and 410, and down through mast 104 to inverter 510 and/or battery charge controller 512 for charging one or more batteries 514.

Figure 6:
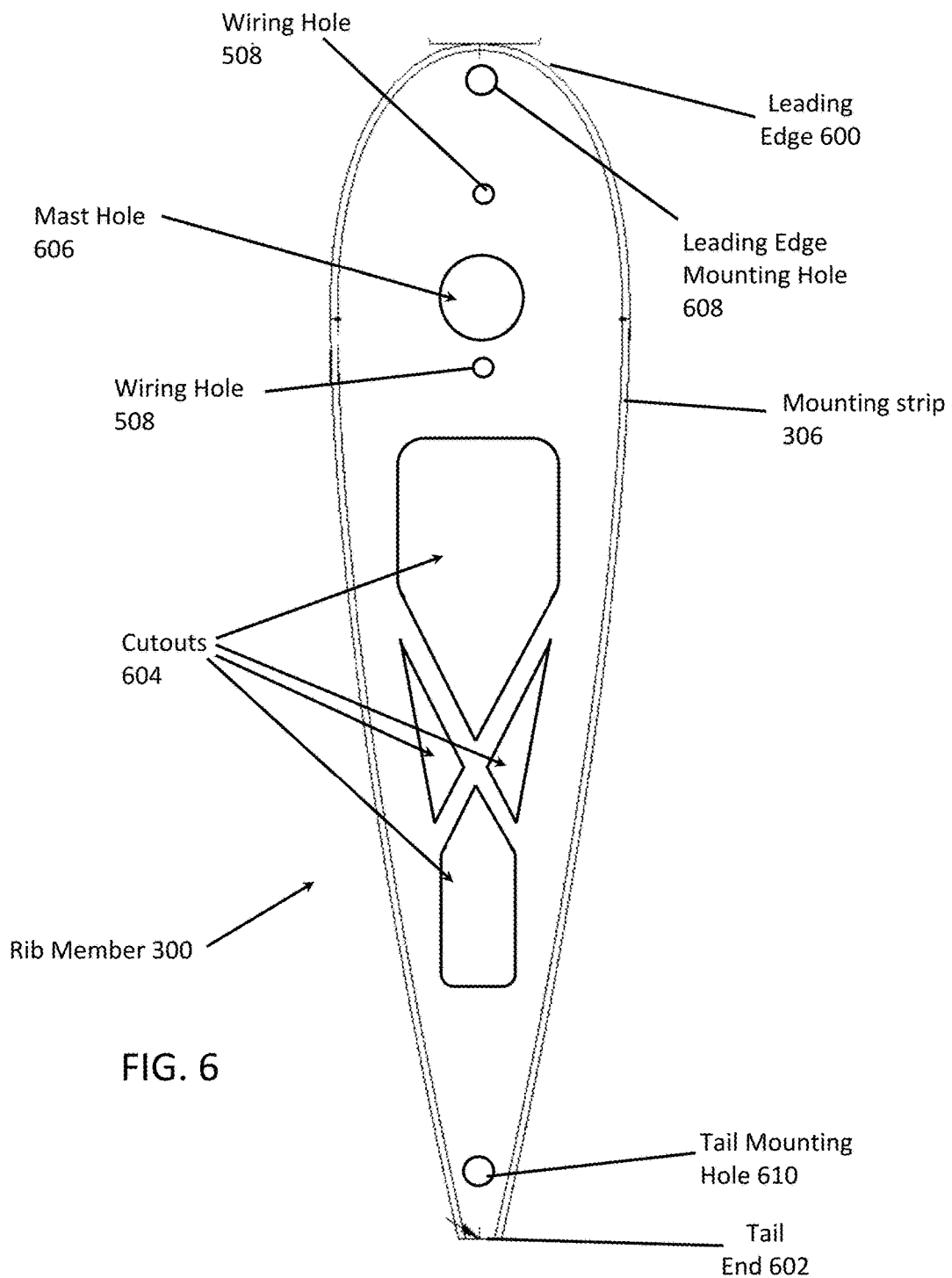
FIG. 6 is a top, plan view of one embodiment of a structural rib member that forms the solar rib assemblies as shown in FIG. 1.

FIG. 6 is a top, plan view of one embodiment of structural rib member 300. In this embodiment, rib member 300 is shaped in the form of a symmetric airfoil, with a rounded leading portion 600 and a tapered trailing end 602. The dimensions and shape of rib member 300 define lift characteristics that propel sailing vessel 100 into the wind. In one embodiment, the chord length of rib member 300 is 850 mm, it's aerodynamic thickness, or "max thickness" as shown in FIG. 2, is 200 mm and its structural thickness is 12 mm. Rib member 300 may be manufactured from any rigid material, however it is generally desirable to use lightweight materials such as composite material comprising foam and carbon fiber or fiberglass. One or more cutouts 604 may be employed to further limit the weight of rib member 300.

Rib member 300 further comprises a mast hole 606, sized to accommodate a diameter of mast 104 and/or electrical DC coupling device 304. One or more wiring holes 508 may be formed through rib member 300 in order to pass one or more electrical wires, such as wires from other solar arrays located on other solar rib assemblies, as shown in FIG. 5. In one embodiment, each rib member 300 further comprises a leading end through hole 608 and a tail end through hole 610, sized and shaped to receive a leading strut 116 and a trailing strut 118, respectively (as shown in FIG. 1). Leading strut 116 and trailing strut 118 are rigid or semi-rigid, longitudinal members that may be used to connect the leading ends and the trailing ends of each of the solar rib assemblies, respectively, to define a height of wing sail 102, as well as a spacing of each solar rib assembly with respect to each other. The struts are affixed to the through holes via known mechanical means, such as bolts, rivets, screws, welds, glue, etc. The struts may be manufactured from a rigid or semi-rigid material, such as metal, wood, fiberglass, plastic, etc.

Figure 7:
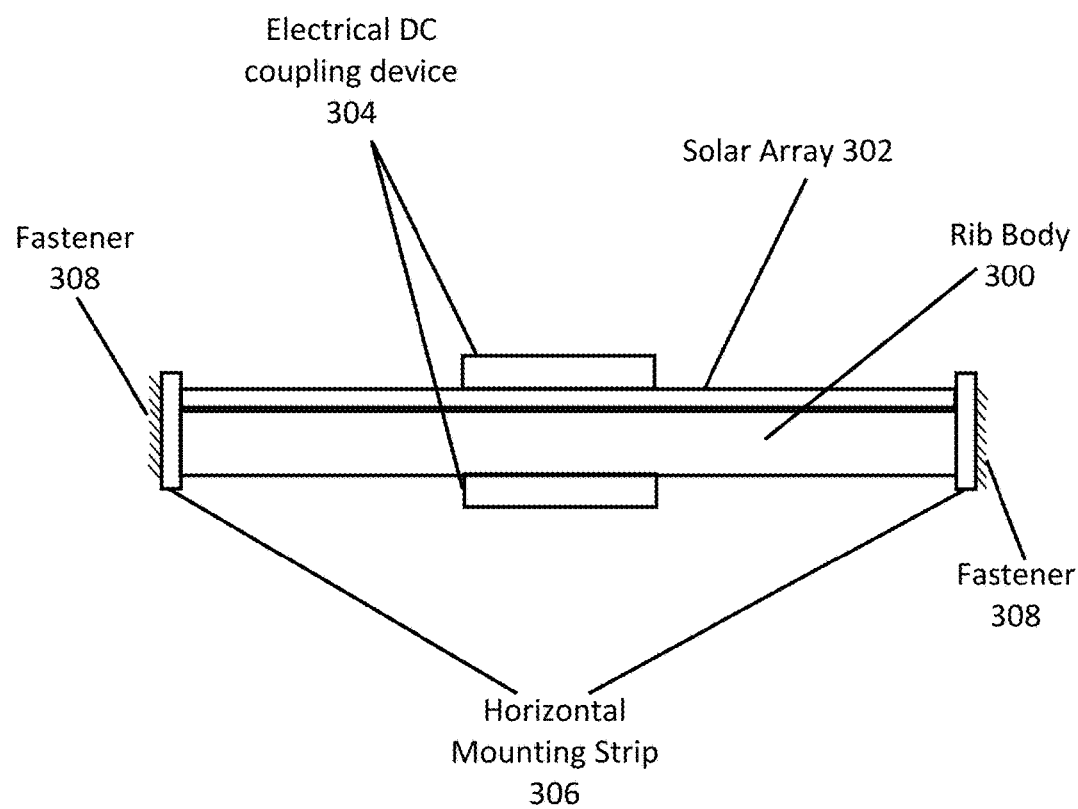
FIG. 7 is a side, longitudinally view of one embodiment of the solar rib assembly as shown in FIG. 1, from tail end perspective.

Mounting strip 306 is shown in FIG. 6 is a continuous strip of rigid or semi-rigid material formed along the entire perimeter of rib member 300. Mounting strip 306 is used in connection with one or more fasteners 308 positioned on an outer surface of mounting strip 306 to attach sail 112 to each rib member around each rib perimeter. Another view of mounting strip 306 is shown in FIG. 7, where a typical solar rib assembly 110 is shown in a side view, looking longitudinally from tail end 602.

Figure 8:
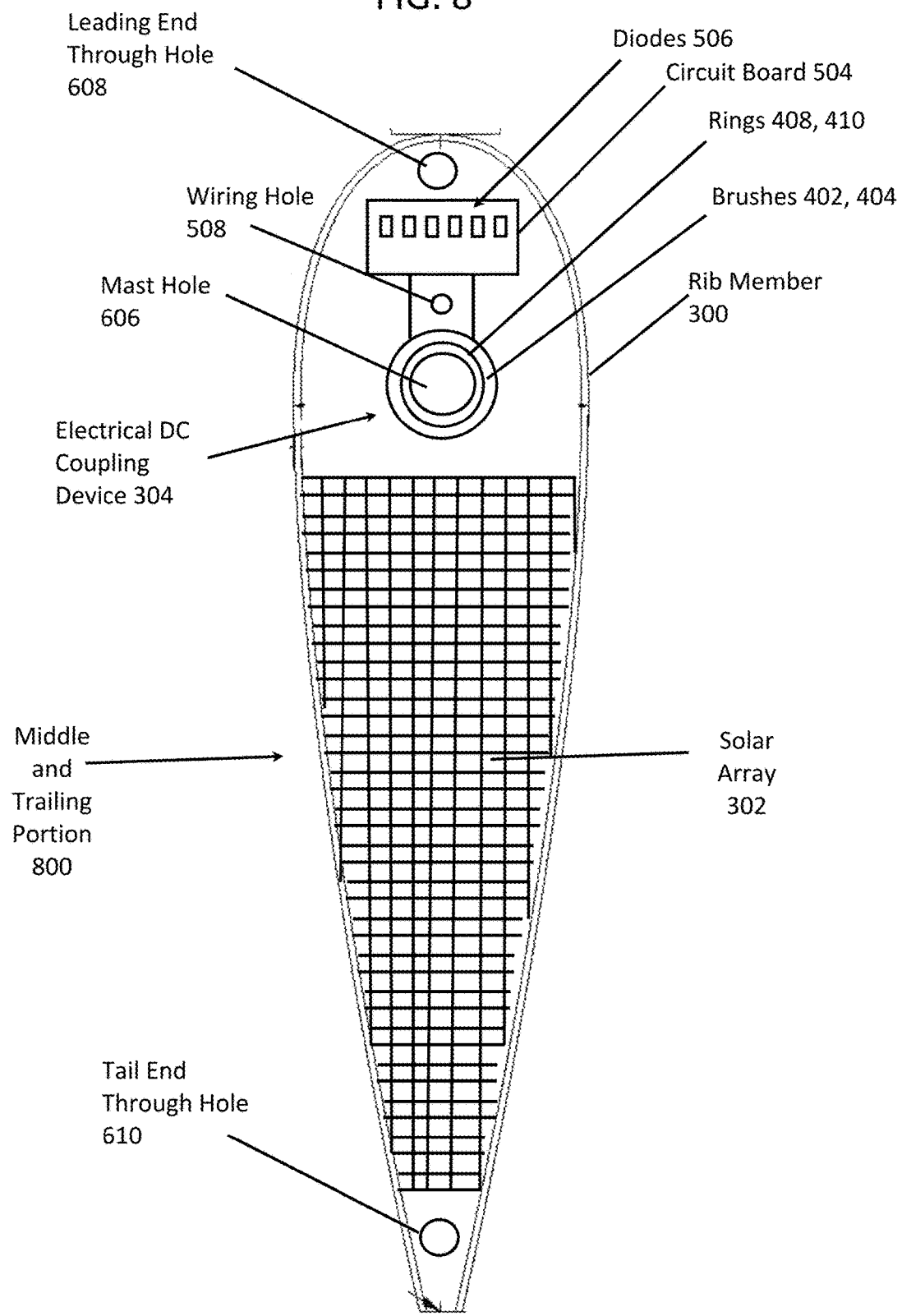
FIG. 8 is a top, plan view of one embodiment of a typical solar rib assembly as used in the solar rib assemblies shown in FIG. 1.

FIG. 8 is a top, plan view of one embodiment of solar rib assembly 110. In this view, solar array 302 is placed on a top surface of rib member 300, covering a large portion of a middle and trailing portion 800 of rib member 300. The one or more solar arrays 302 may be manufactured together with rib member 300 as a unit, or they may be affixed to the top surface of rib member 300 using traditional methods, such as by gluing, bolting, riveting, screwing, etc. Solar array 302 comprises one or more solar cells, such as monocrystalline, polycrystalline, thin-film, or one of a plurality of photovoltaic cells to generate power from the sun. The cells may be formed from a single panel of cells or multiple, smaller panels. The DC voltage(s) vary in relation to an area of solar array 302, as well as the time of day, shading, soiling, and other factors. In one embodiment, each solar array 302 approximates the area of a middle and an aft portion of each solar rib assembly, as shown. In other embodiments, solar array 302 may additionally be placed on the leading end 310 of structural rib member 300. The power output by solar array 302 is generally proportional to its surface area. Solar array 302 may be formed using one or more rectangular solar panels widely available to the general public, and may be selected to achieve a particular maximum output power, such as 50 watts, when the sun illuminates solar array 302 at an optimal angle.

Figure 9:
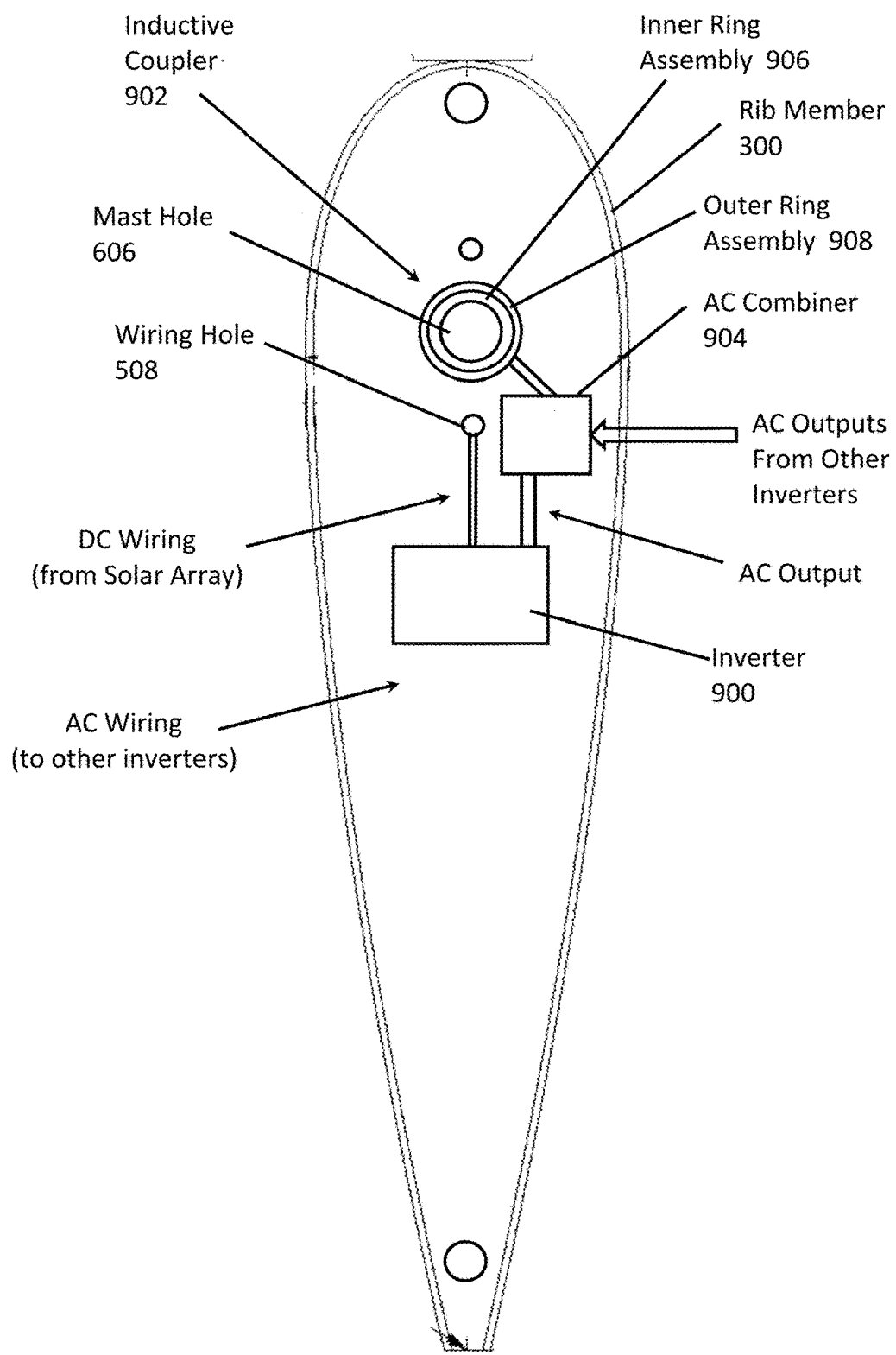
FIG. 9 is a bottom, plan view of one embodiment of a solar rib assembly comprising an inverter.

FIG. 9 is a bottom, plan view of one embodiment of solar rib assembly 110. In this embodiment, solar rib assembly 110 comprises inverter 900 mounted to a bottom surface of rib assembly 300, coupled to solar array 302 via DC wiring routed through rib member 300 and wiring hole 508. Solar array 302 provides DC voltage to inverter 900, and inverter 900 converts the DC voltage into an AC voltage. Such inverters are well known in the art. The AC voltage generated by inverter 900 may be combined with AC voltages from other inverters located on other solar rib assemblies, so that the voltage from the inverters are wired in parallel. Embodiments using inverter 900 may be useful for challenging shading conditions that may be produced by the presence of mast 104 and/or the stacked nature of the solar rib assemblies. The AC power from inverter 900 is provided to AC combiner 904, which may comprise, simply, a terminal strip or junction box, designed to electronically combine voltages from two or more inverters in parallel. AC combiner receives AC outputs from the other inverter(s), combines the voltages, and then provides the combined AC voltage to inductive coupler 902. Inductive coupler 902 typically comprises an annular inner ring assembly 906 rotatably located within an annular outer ring assembly 908. Each of the annular rings typically comprises a magnetic core wrapped with an insulated wire. The combined AC voltage from AC combiner 904 is applied to wire on the annual outer ring, which in turn induces a voltage onto a wire wrapped around the annual inner ring through electromagnetic induction. The wire wrapped around the annual inner ring is routed, in one embodiment, inside of mast 104, down to an AC-to-DC converter, where the DC output of the AC-to-DC converter may be used to power onboard electronics and/or to charge one or more batteries via a battery charge controller.

Figure 10:
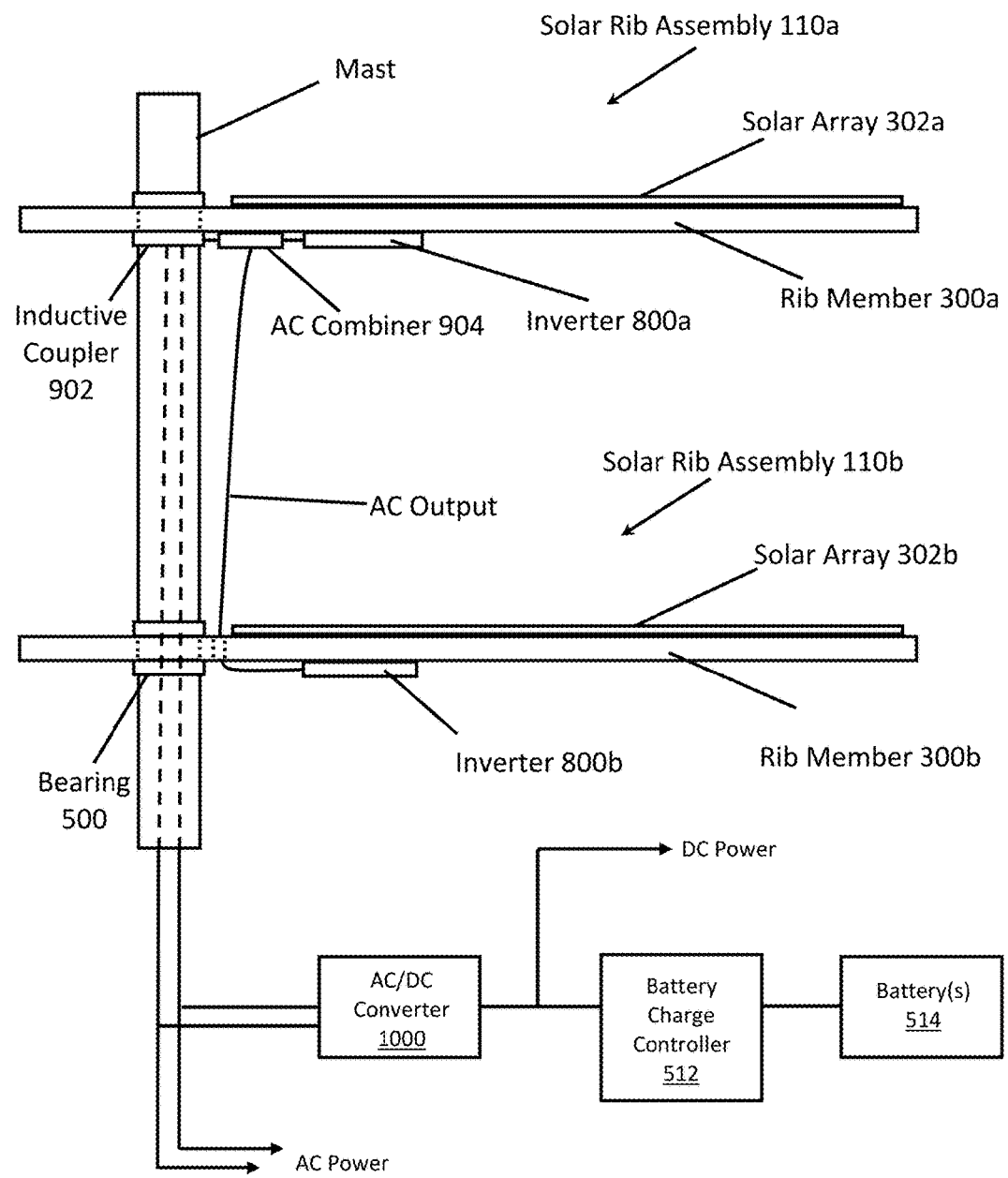
FIG. 10 is a side view of another embodiment of a portion of the sailing vessel shown in FIG. 1, illustrating two solar rib assemblies coupled to a mast and electrically coupled together using inverters.

FIG. 10 is a side view of a portion of solar wing sail 102 installed onto mast, in an embodiment where inverters are used, as described above with respect to FIG. 9. In this embodiment, only the two upper-most solar rib assemblies are shown, each solar rib assembly comprising a solar array 302 mounted to a rib member 300, and an inverter 900 mounted to a bottom surface of each rib member. The output of the inverters are combined via AC combiner 904, which is located underneath solar rib assembly 110a. The combined AC voltage is provided to inductive coupler 902 via outer ring 908, where it is transferred to a wire of inner ring 906 via inductive or magnetic coupling. The AC voltage induced on the wire is routed, in one embodiment, down through mast 104, where it is provided to AC electronics onboard sailing vessel 100 and/or provided to AC-to-DC converter 1000, where the output of AC-to-DC converter 1000 is a DC voltage used to power onboard electronics and/or charge one or more batteries 514 via battery charge controller 512.

Figure 11:
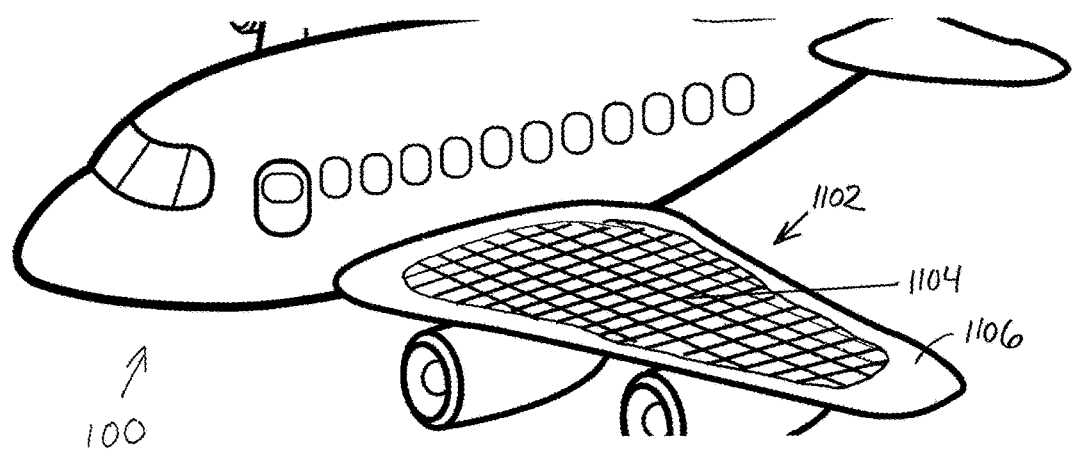
FIG. 11 is a perspective view of one embodiment of an airplane comprising a solar wing.

FIG. 11 is a perspective view of one embodiment of an airplane 1100 comprising a solar wing 1102 in accordance with the teachings herein. In this embodiment, solar wing 1102 is used to both provide lift to airplane 1100, as well as to generate electric power for use by airplane 1100 (such as general electronic avionics, lighting, entertainment systems, etc.) and/or by electron devices carried by passengers and crew members (such as cell phones, tablet computers, etc.). The wing 1100 is defined by a "skin" 1112 that defines an airfoil. The skin 1112 comprises well-known materials such as aluminum, impregnated fabrics or composite materials. However, the area above the solar cells 1104 comprises a transparent material, such as clear plastic, glass, clear vinyl, or other transparent or semi-transparent material. One or more solar cells 1104 is/are shown mounted inside a compartment 1110 formed within aircraft wing 1106, underneath a transparent material 1108 covering at least the area directly over solar cells 1104. Each of the solar cells produce electricity when illuminated by the sun through transparent material 1108. Typically, an array of solar cells is formed together on a substrate, forming a solar panel. While the solar cells 1104 are shown in FIG. 1 as a single, contiguous solar panel, customized in shape to fit inside an airplane wing, in other embodiments, two or more solar panels could be used instead, either as custom-sized panels, as off-the-shelf commercially available solar panels, or a combination of the two.

Figure 12:
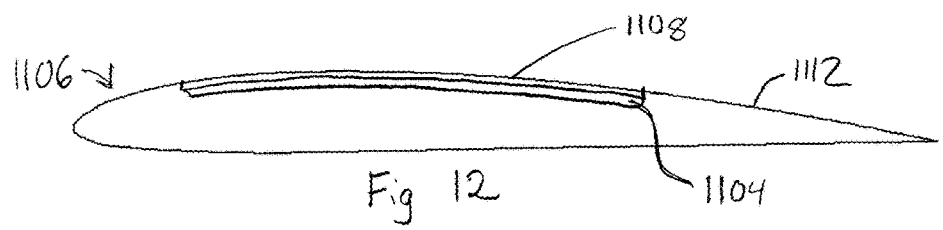
FIG. 12 illustrates the solar wing as shown in FIG. 11 from a side, cutaway view.

FIG. 12 illustrates solar wing 1102 from a side, cutaway view, showing one embodiment where the solar cells 1104 comprise a flexible array of solar cells, with the solar cells facing upwards, towards the sun. In this embodiment, the flexible array is made by a process where photovoltaic material is deposited on a flexible substrate, such as ordinary paper or plastic, using, for example, chemical vapor deposition technology. After construction, the flexible array may be adhered to an inner surface the transparent material 1108, such as by applying a thin layer of transparent adhesive, or it may be set in place by mechanically attaching it to a mechanical support structure (not shown), such as a platform, one or more cross-members, etc.

Figure 13:
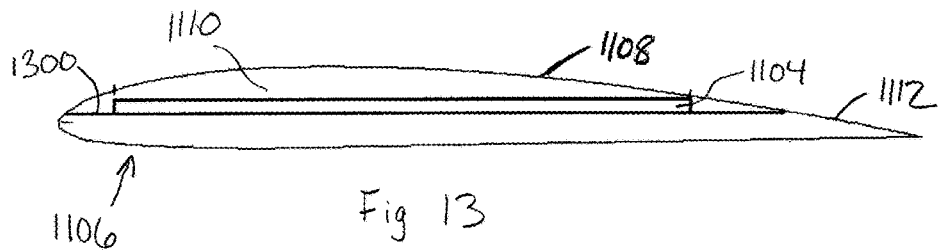
FIG. 13 illustrates another embodiment of the solar wing as shown in FIG. 11 from a side, cutaway view.

FIG. 13 illustrates another embodiment of solar wing 1102 from a side, cutaway view. In this embodiment, the solar cells 1104 are formed into one or more rigid solar panels, either customized to fit within wing 1106 or standard, off-the-shelf solar panels, typically rectangular in shape and having between 50 and 72 solar cells in each panel. The solar panel(s) is/are affixed to a mechanical structure, such as a frame 1300 affixed inside the wing 1106 using conventional fastening techniques, with the solar cells facing upwards, towards the sun.

In either embodiment, electricity generated by the solar cells 1104 is typically provided to a battery charging system and/or inverter within airplane 1100, either within wing 1106 or somewhere else aboard airplane 1100, similar to what is shown in FIGS. 5 and 10, such as inverter 510 and/or battery charge controller 512.

Figure 14:
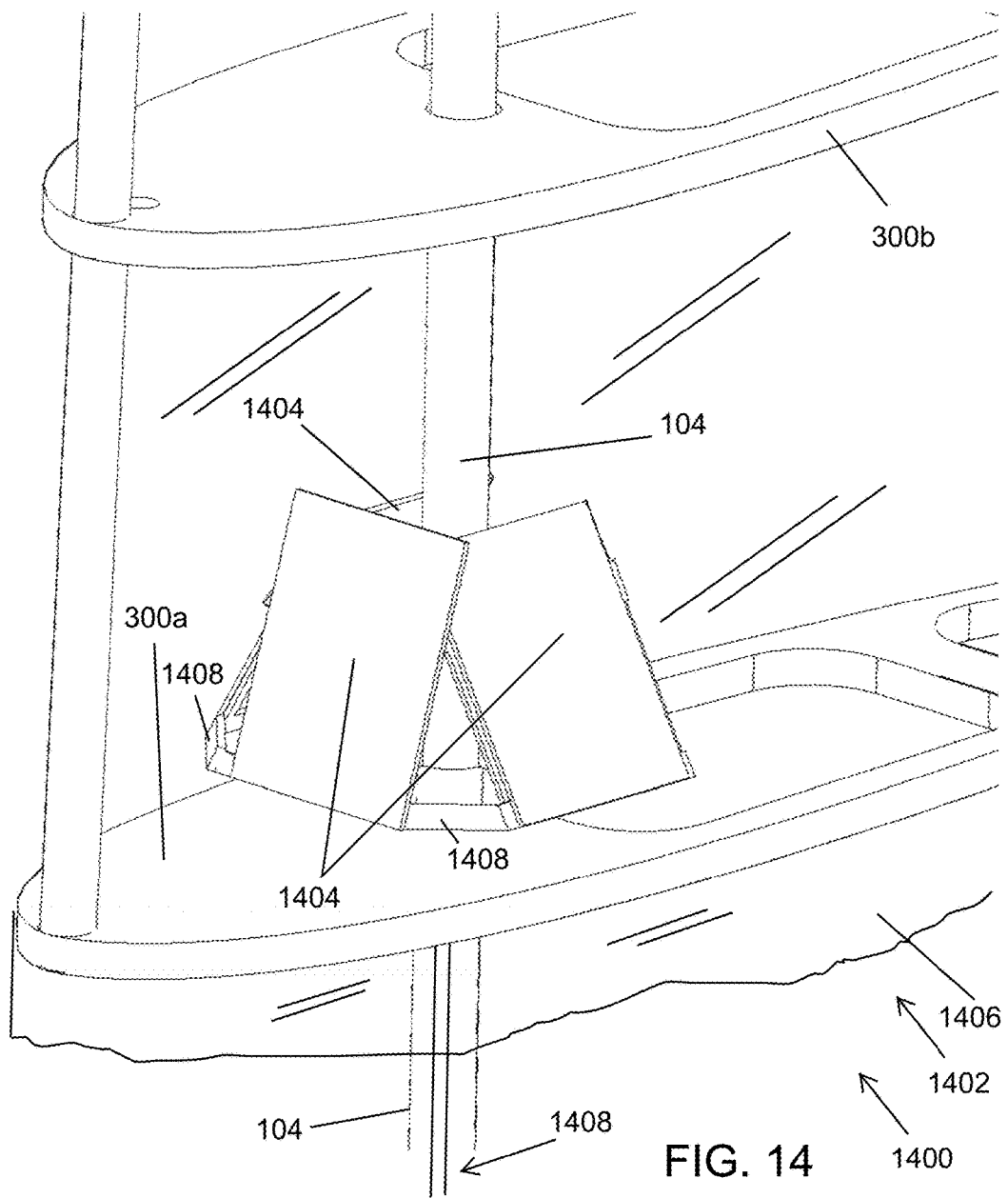
FIG. 14 is a perspective view of another embodiment of a solar wing sail.

FIG. 14 is a perspective view of another embodiment of a solar wing sail. In this embodiment, transparent wing sail 1400 comprises a transparent wing 1402 and one or more photovoltaic cells or panels 1404 (sometimes referred to as a photovoltaic array), herein "panels 1404", mounted to mast 104 and between structural rib member 300*a* and 300*b*, in this embodiment, close to structural rib member 300*a*. The panels 1404 comprise one or more photovoltaic cells or panels arranged at least partially around mast 104. In the embodiment shown in FIG. 14, three photovoltaic panels are used.

The panels 1404 are housed inside of transparent wing 1402 and are thus protected from environmental elements such as water, salt, bird droppings, etc. The nature of transparent membrane, or skin, 1406 allows sunlight to penetrate inside wing 1402 and illuminate the panels 1404, thus causing the panels 1404 to create electricity. It should be understood that although only one grouping of three panels 1404 is shown in FIG. 14, in other embodiment, one or more other sets of panels 1404 could be mounted between other structural rib members. For example, a second set of panels 1404 could be mounted to mast 104 just above structural rib member 300*b*. In these embodiments, each of the sets of panels 1404 could be wired together, either in parallel or in series, to generate electrical power for use onboard a sailing vessel. In one embodiment, the panels 1404 are mounted to at least one mounting bracket 1408, which is in turn fixed to mast 104 via traditional mechanical fastening means.

Transparent wing 1402 comprises two or more structural rib assemblies, for example, structural rib assembly 300*a* and 300*b* although, typically, three or more structural rib assemblies are used in order to achieve a desired height of the transparent wing 1402. The structural rib assemblies are the same or similar to what was described in FIG. 6, above. They are generally aligned with one another, with mast 104 projecting through a mast hole 606 in each rib assembly. In this embodiment, mast 104 is stationary, and each structural rib assembly is rotatably coupled to mast 104 without solar panels 1404 interfering with transparent membrane. In other words, the enclosure formed by the perimeter of the structural rib assemblies and the top and bottom surfaces of adjacent structural rib assemblies is large enough to prevent the transparent membrane from contacting the solar panels 1404.

In one embodiment, one or more of the structural rib assemblies comprises a rotary bearing mounted to mast hole 606, the same or similar to rotary bearing 500 described in FIG. 5.

When membrane 1406 is draped or wrapped around a perimeter of each of the structural rib assemblies, it forms a protective enclosure around the panels 1404, defined by the perimeter of the structural rib assemblies, the bottom of structural rib assembly 300*b* and the top of structural rib assembly 300*a*. In embodiments where three or more structural rib assemblies are used, multiple enclosures are formed, each enclosure defined by the perimeter of the structural rib assemblies, and the top and bottom surfaces of adjacent structural rib assemblies. In FIG. 14, In FIG. 14, membrane 1406 is shown having streak lines for purposes of representing a transparent material in a perspective drawing.

While the foregoing disclosure shows illustrative embodiments of the invention, it should be noted that various changes and modifications could be made herein without departing from the scope of the embodiments as defined by the appended claims. Furthermore, although elements of the invention may be described or claimed in the singular, the plural is contemplated unless limitation to the singular is explicitly stated.

We claim:

1. A solar wing sail for generating electrical power on a sailing vessel, comprising:
   a transparent wing, comprising:
      a plurality of solar rib assemblies coupled to a mast, separated from each other by one or more predetermined distances, each of the plurality of solar rib assemblies comprising a respective photovoltaic array for generating the electrical power as each photovoltaic array is illuminated by light, wherein at least two of the plurality of solar rib assemblies comprises a mast hole for receiving the mast; and an electrical DC coupling device mounted to the mast hole, the electrical DC coupling device for providing a DC voltage generated by the photovoltaic array to a fixed location onboard the sailing vessel; and
      a transparent membrane coupled to at least some of the plurality of solar rib assemblies along a respective edge of the plurality of solar rib assemblies to form an airfoil.

2. The solar wing sail of claim 1, wherein a chord line of at least some of the plurality of solar rib assemblies is equal to a corresponding camber line of the at least some of the plurality of rib assemblies.

3. The solar wing sail of claim 1, wherein the at least two electrical DC coupling devices are wired together in series to generate a DC voltage equal to a sum of voltages generated by the electrical DC coupling devices.

4. The solar wing sail of claim 1, wherein each of the electrical DC coupling devices comprises:
   a first portion mechanically coupled to the mast hole and electrically coupled to a first photovoltaic array; and
   a second portion in mechanical contact with the first portion.

5. The solar wing sail of claim 1, wherein a first solar rib assembly comprises:
   an inductive rotary coupler mounted through a mast hole; and
   an inverter for receiving the electrical power from at least one of the photovoltaic arrays and for converting the electrical power into AC power;
   wherein the AC power is coupled by the inductive rotary coupler to a fixed destination onboard the sailing vessel.

6. The solar wing sail of claim 1, wherein at least some of the plurality of solar rib assemblies comprises a vertical mounting strip formed around a perimeter of at least some of the solar rib assemblies, the vertical mounting strip comprising one or more fasteners disposed along an outside surface of the vertical mounting strip, and the transparent membrane comprises a number of sections, each section comprising a top edge and a bottom edge, each edge comprising a reciprocal faster.

7. The solar wing sail of claim 1, wherein the transparent membrane is formed from a flexible material that allows the transparent membrane to furl.

8. The solar wing sail of claim 1, wherein the transparent membrane is formed from a rigid material that does not allow the transparent membrane to furl.

9. The solar wing sail of claim 1, wherein the transparent membrane comprises a number of sections, each section comprising a horizontal portion of the transparent membrane, each section comprising a top edge and a bottom edge comprising one or more fasteners, the fasteners for mechanically coupling the top edge to a first solar rib assembly and the bottom edge to a second solar rib assembly.

10. A solar wing sail, comprising:
a plurality of solar rib assemblies, parallel and spaced apart from each other, each comprising:
a structural rib, comprising a mast hole formed though a portion of the structural rib, sized and shaped to accommodate a mast of a sailing vessel;
a solar array mechanically coupled to the structural rib; and
a rotary electrical DC coupling device for coupling a DC voltage generated by the solar array to a fixed location; and
a sail formed around a perimeter of each of the plurality of solar rib assemblies to form an airfoil.

11. The solar wing sail of claim 10, wherein a chord line of at least some of the plurality of solar rib assemblies is equal to a corresponding camber line of the at least some of the plurality of rib assemblies.

12. The solar wing sail of claim 10, further comprising:
a first longitudinal member placed through a first hole in a leading portion of each of the plurality of solar rib assemblies; and
a second longitudinal member placed through a second hole in a trailing portion of each of the plurality of solar rib assemblies.

13. The solar wing sail of claim 10, wherein each of the electrical DC coupling devices comprises:
a first portion mechanically coupled to the mast hole and electrically coupled to the solar array; and
a second portion in mechanical contact with the first portion.

14. The solar wing sail of claim 10, wherein at least one of the plurality of solar rib assemblies further comprise:
an inductive rotary coupler mounted through the mast hole; and
an inverter for receiving the DC power from the solar array and for converting the DC power into AC power;
wherein the AC power is coupled by the inductive rotary coupler to a fixed destination.

15. The solar wing sail of claim 10, wherein the plurality of solar rib assemblies each comprises a vertical mounting strip formed around a perimeter of each solar rib assembly, the vertical mounting strip comprising one or more fasteners disposed along an outside surface of the vertical mounting strip, and the sail comprises a number of reciprocal fasteners for securing the sail to the one or more fasteners.

16. The solar wing sail of claim 10, wherein the sail is formed from a transparent material.

17. The solar wing sail of claim 10, wherein the sail is formed from a flexible, transparent material that allows the transparent sail to furl.

18. The solar wing sail of claim 10, wherein the sail is formed from a rigid material that does not allow the sail to furl.

19. The solar wing sail of claim 10, wherein the sail comprises a number of sections, each section comprising a horizontal portion of the sail, each section comprising a top edge and a bottom edge comprising one or more reciprocal fasteners, the reciprocal fasteners for mechanically coupling the top edge to a first vertical mounting strip of a first solar rib assembly and the bottom edge to a second vertical mounting strip of a second solar rib assembly.

* * * * *